United States Patent [19]

Anagnostopoulos et al.

[11] Patent Number: 5,500,572
[45] Date of Patent: Mar. 19, 1996

[54] HIGH RESOLUTION IMAGE SOURCE

[75] Inventors: Constantine N. Anagnostopoulos, Mendon; Jon K. Edwards, Rochester, both of N.Y.

[73] Assignee: Eastman Kodak Company, Rochester, N.Y.

[21] Appl. No.: 29,725

[22] Filed: Mar. 11, 1993

Related U.S. Application Data

[62] Division of Ser. No. 815,466, Dec. 31, 1991, Pat. No. 5,237,180.

[51] Int. Cl.$^6$ ................................................ H05B 37/02
[52] U.S. Cl. ................................ 315/169.1; 250/423 F
[58] Field of Search ................... 315/169.1; 250/423 F, 250/423 R

[56] References Cited

U.S. PATENT DOCUMENTS

| | | | |
|---|---|---|---|
| 3,665,241 | 5/1972 | Spindt et al. | 313/351 |
| 3,675,063 | 7/1972 | Spindt et al. | 313/104 |
| 3,775,704 | 8/1973 | Spindt et al. | 313/309 |
| 3,789,471 | 2/1974 | Spindt et al. | 29/25.17 |
| 3,792,465 | 2/1974 | Collins et al. | 340/324 R |
| 3,812,559 | 5/1974 | Spindt et al. | 29/25.18 |
| 3,931,633 | 1/1976 | Shannon et al. | 357/30 |
| 3,973,136 | 8/1976 | Lee | 307/221 D |
| 4,020,381 | 4/1977 | Oess et al. | 313/302 |
| 4,178,531 | 12/1979 | Alig | 313/409 |
| 4,303,930 | 12/1981 | Van Gorkom et al. | 357/13 |
| 4,370,797 | 2/1983 | Van Gorkom et al. | 29/569 R |
| 4,482,836 | 11/1984 | Washington et al. | 313/104 |
| 4,513,308 | 4/1985 | Greene et al. | 357/55 |
| 4,575,765 | 3/1986 | Hirt | 358/230 |
| 4,719,388 | 1/1988 | Oess | 315/169.1 |
| 4,721,885 | 1/1988 | Brodie | 313/576 |
| 4,763,187 | 8/1988 | Biberian | 358/56 |
| 4,801,850 | 1/1989 | Kazan | 315/169.3 |
| 4,801,994 | 1/1989 | Van Gorkom et al. | 357/52 |
| 4,803,565 | 2/1989 | Teshigawara et al. | 358/300 |
| 4,806,827 | 2/1989 | Eschard | 313/533 |
| 4,818,914 | 4/1989 | Brodie | 315/169.3 |
| 4,825,118 | 4/1989 | Kyushima et al. | 313/104 |
| 4,857,799 | 8/1989 | Spindt et al. | 313/495 |
| 4,874,981 | 10/1989 | Spindt | 313/309 |
| 4,884,010 | 11/1989 | Biberian | 315/366 |
| 4,908,539 | 3/1990 | Meyer | 315/169.1 |
| 5,012,153 | 4/1991 | Atkinson et al. | 313/336 |
| 5,237,180 | 8/1993 | Anagnostopoulos et al. | 250/423 F |

FOREIGN PATENT DOCUMENTS

| | | |
|---|---|---|
| 0390205 | 10/1990 | European Pat. Off. . |
| 0492585 | 7/1992 | European Pat. Off. . |
| 2604823 | 10/1986 | France . |
| 3219074 | 11/1983 | Germany . |
| WO91/15874 | 10/1991 | WIPO . |

OTHER PUBLICATIONS

"Channel Electron Multipliers," E. A. Kurz, *American Lab.*, Mar. 1979.

"HOT Microchannel Plates," Galileo Electro–Optics Corp., Data Sheet No. 9200.

"Multiple–Dynode–Layer Microchannel Plate," B. E. Woodgate, *NASA Tech. Briefs*, Jul. 1990.

(List continued on next page.)

*Primary Examiner*—Robert J. Pascal
*Assistant Examiner*—Michael B. Shingleton
*Attorney, Agent, or Firm*—David M. Woods

[57] ABSTRACT

Image source, for converting image data in the form of serial charges into a high-resolution imagewise light pattern, includes a CCD emitter having a semiconductor charge-coupled device (CCD) structure for receiving and transferring the charges, a charge amplification means including a charge-modulated control field effect transistor structure (C-FET), and plural small-scale field emission cells (FEC). The CCD emitter is operable to convert the charges to an imagewise pattern of electron emissions that are directed to a luminescent phosphor layer susceptible to light output according to the impact of the incident electrons. The light output may be directed onto a photosensitive image recording medium to provide means for image recording, or in alternative embodiments, the light output may be viewed directly.

26 Claims, 6 Drawing Sheets

OTHER PUBLICATIONS

*Flat Panel Displays and CRT's*, L. E. Tannas, Jr., 1985, Van, Nostrand, and Reinhold, pp. 189–193.

"Selecting Phosphors for Displays," Ken Compton, *Information Display*, Jan. 1989.

*Vacuum Microelectronics 1989*, Institute of Physics Conf. Ser. No. 99, R. E. Turner, ed.; end page.

*Bell System Technical Journal*, vol. 49, Apr. 1970, pp. 587–593, (W. S. Boyle and G. E. Smith) "Charge Coupled Semiconductor Devices".

*IEEE Transactions on Electron Devices*, vol. 38, No. 10, Oct. 1991, New York, NY, US pp. 2398–2400, XP225976 R. Z. Bakhtizin et al "GaAs Field Emitter Arrays".

*Technical Digest of International Vacuum Microelectroncs Conference '91*, pp. 200–201, Ting et al, "Field Effect Controlled Vacuum Field–Emission Cathodes".

Kosmahl, "A Wide–Bandwidth High–Gain Small–Size Distributed Amplifier with Field–Emission Triodes (FET-RODE's) for the 10 to 300 GHz Frequency Range" *IEEE Trans. Electr. Devices*, vol. 36, No. 11, Nov. 1989.

Abstract of paper entitled "Serial Addressing for Field Emission Tips Flat Panel TV" presented by Biberian, J. P. at the Second Int'l. Conf. on Vacuum Microelectronics, Jul. 1989.

"Microvacuum Push"; Ed Lipsett, *Electronic Engineering Times*, Dec. 4, 1989.

"*Vacuum Microelectronics, 1989*," SRI International Business Intelligence Program, Report No. 780.

"Flat CRTs: A Federal Case," D. Lieberman, *Electronic Engineering Times*, Jan. 29, 1990.

"Vacuum Semi R & D Picks Up," H. F. Gray, C. M. Armstrong, R. K. Parker, *Electronic Engineering Times*, Jan. 29, 1990.

"Charge–Coupled Devices—An Overview," Walter F. Kosnocky, vol. 18, Sep. 10–13, pp. 2/1–2/20.

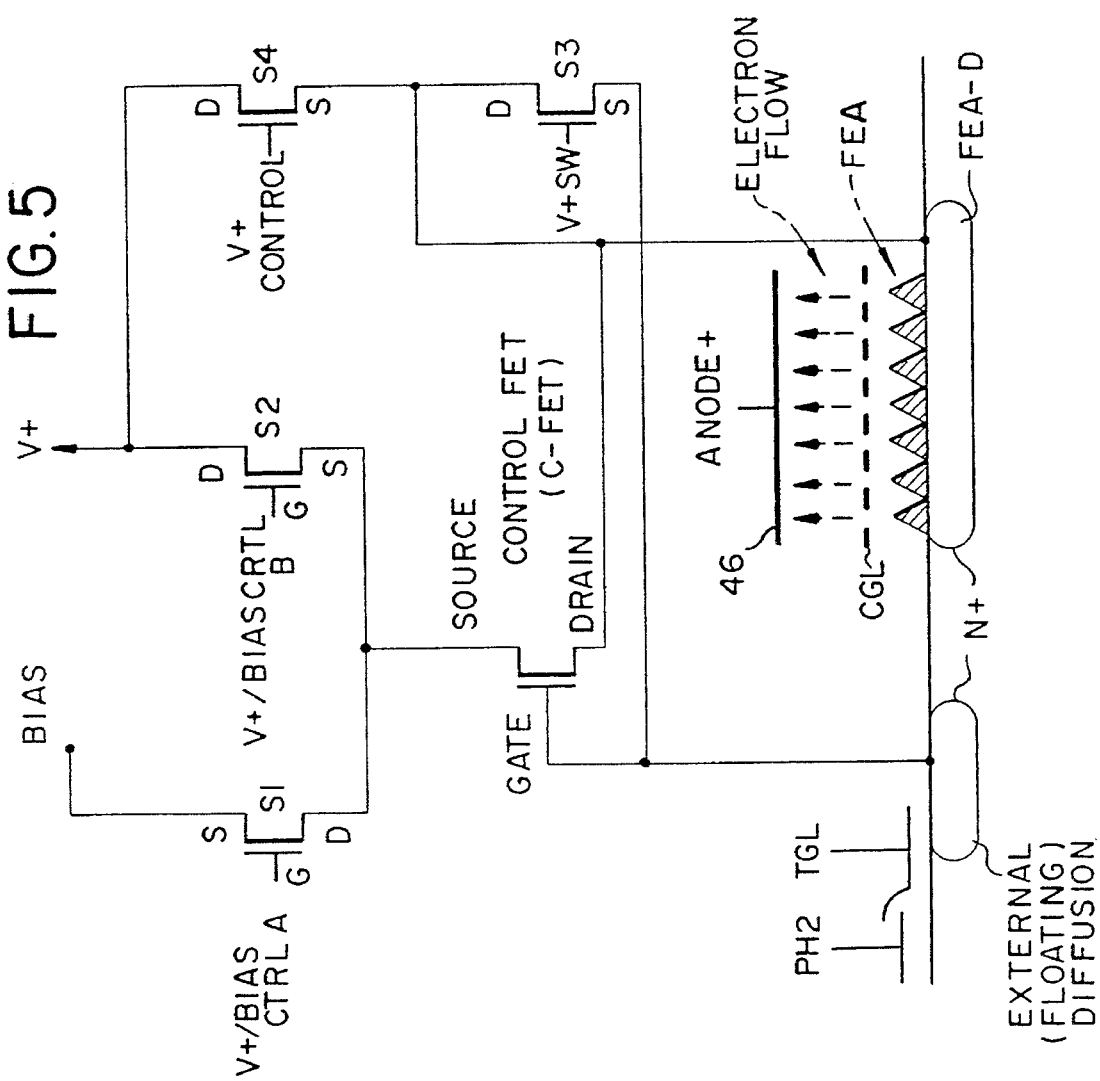

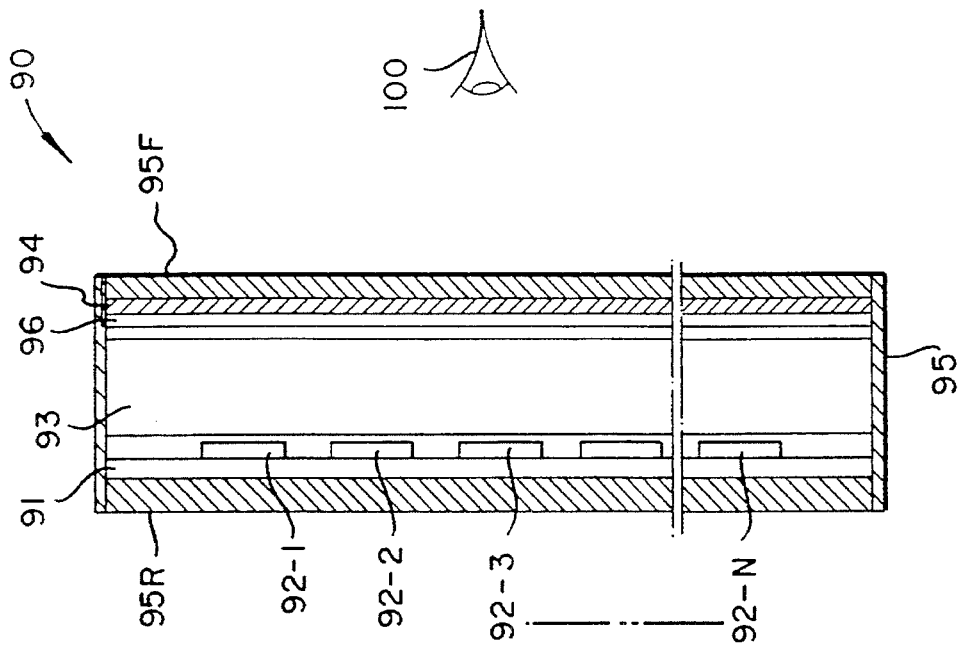
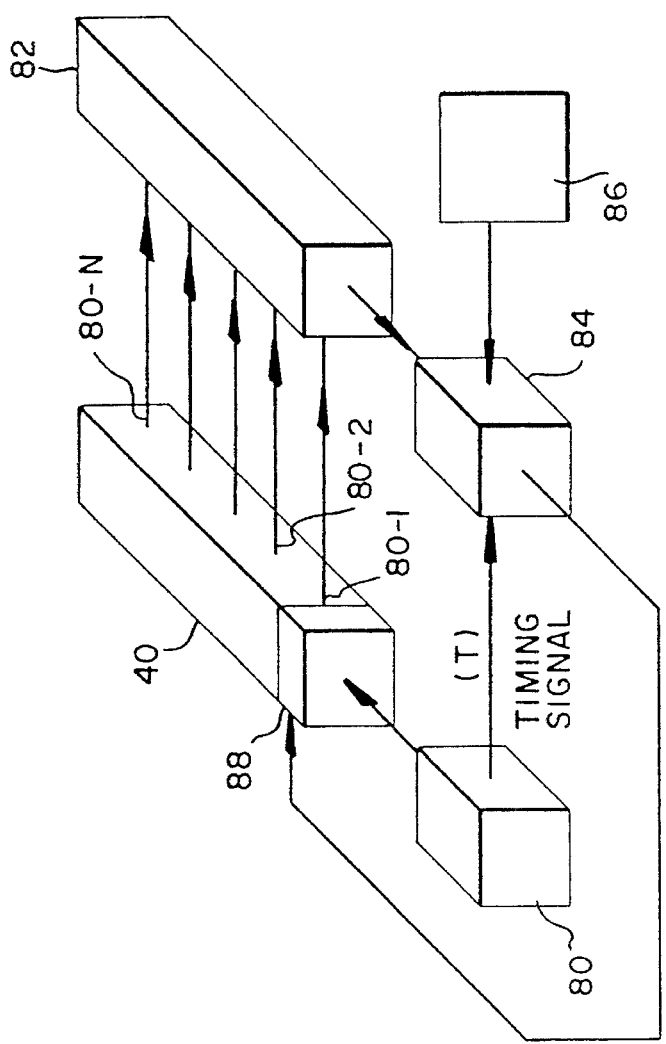
FIG. 7
FIG. 6

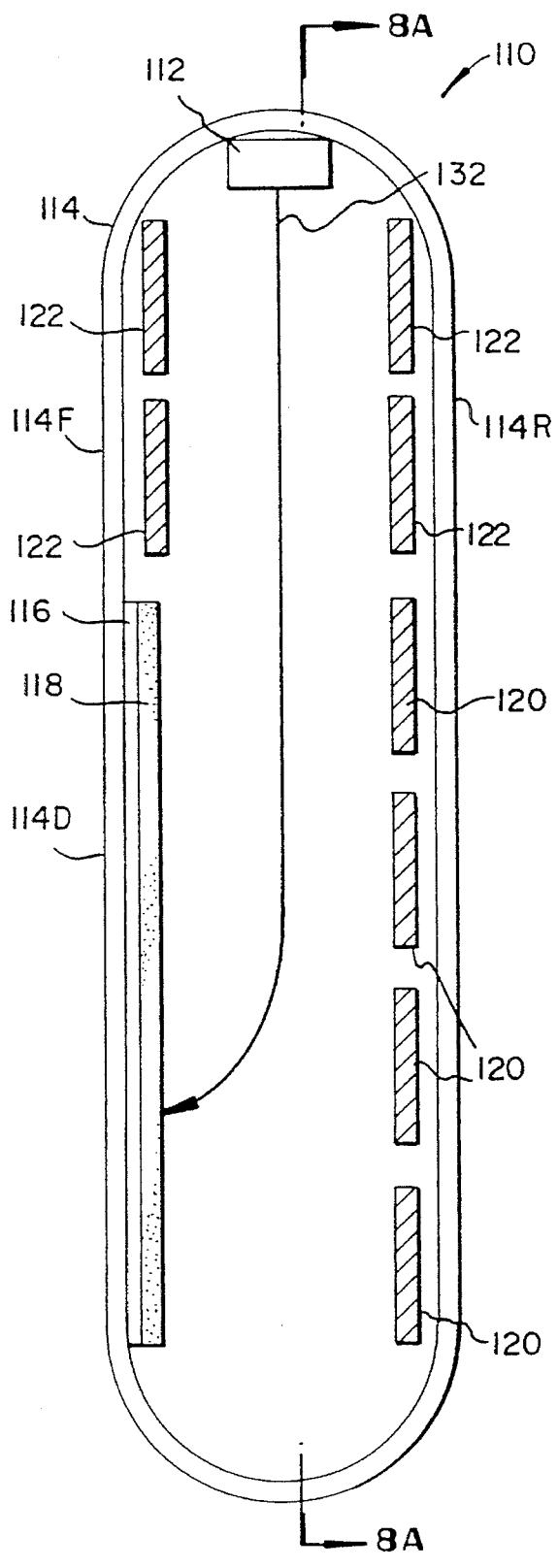
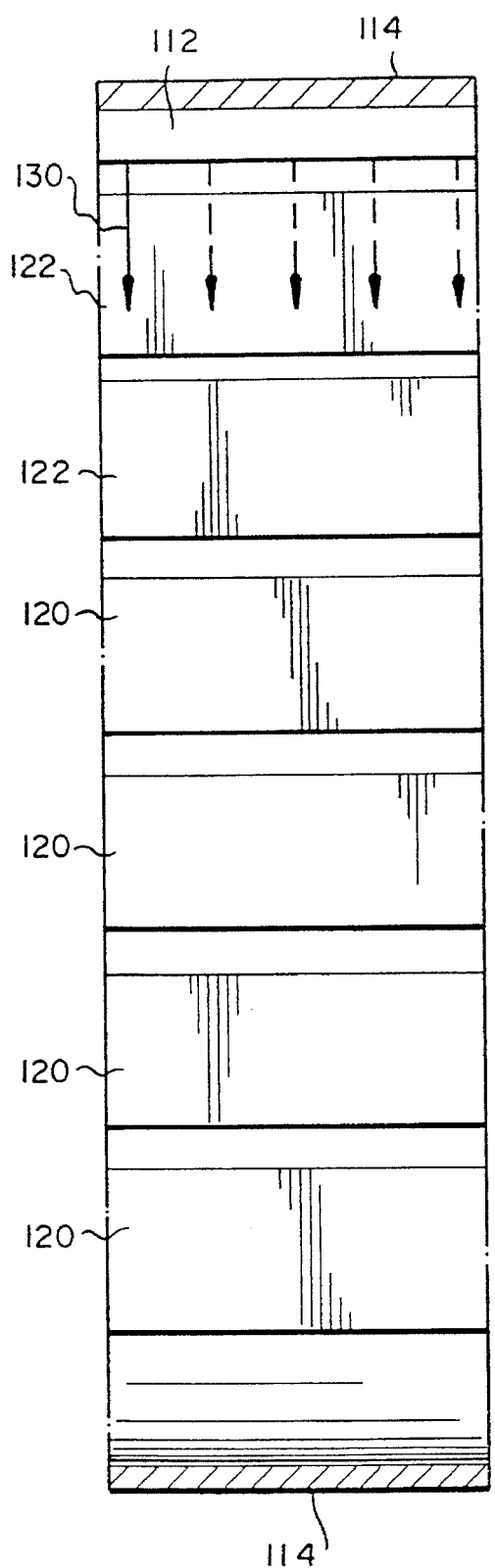
FIG. 8
FIG. 8A

HIGH RESOLUTION IMAGE SOURCE

This is a divisional of application Ser. No. 07/815,466 filed Dec. 31, 1991 now U.S. Pat. No. 5,237,180.

CROSS REFERENCE TO RELATED APPLICATION

This application is related to U.S. patent application Ser. No. 696,428, now U.S. Pat. No. 5,237,180 entitled "High Resolution Image Source", filed on May 6, 1991 in the names of J. K. Edwards and C. N. Anagnostopoulos.

FIELD OF THE INVENTION

The present invention relates generally to image sources and more specifically relates to apparatus for converting an electrical signal, representing an image, into a pattern of light corresponding to that image.

BACKGROUND OF THE INVENTION

Devices have been proposed to convert an electrical signal, representative of image information, to a corresponding imagewise pattern of light. Such conversion devices, hereinafter "image sources", can provide a light image or portion thereof for image display, imagewise exposure of a photosensitive medium, or for delivery to an image information transmission or sensing system.

For example, in a typical image recording system, an image source may be used to provide a pattern of light that exposes and thus alters a photosensitive recording medium in an imagewise fashion. The desired image may be composed and made visible on the recording medium, such as photographic film, or upon other types of receiving media from which the image is transferred to a hard copy medium, such as those used in the electrophotographic art.

If used as an image display device, an image source is expected to produce a light pattern that is to be composed by accumulating line-by-line portions of the image to be displayed, or an entire image frame may be produced substantially at once. For example, planar image display devices have found application as alphanumeric displays.

Electro-optical Element Arrays

Some conventional image sources are constructed from arrays of minute electro-optical elements, such as liquid crystal light shutters, each of which have a limited output area of predetermined geometry and arrangement that selectively transmit or attenuate light from a diffuse light source. Most other image sources have been constructed from arrays of electro-optical point-source elements such as light-emitting diodes that directly generate light.

The foregoing arrays are typically arranged linearly, known as a strip array, or in rows and columns, to form an area array. Each image source array element is addressable according to its position in a row (in a strip array) or a row and column matrix (in an area array). Each element is activated by an addressing scheme for activating at least one address line for each point in the array. Electro-optical elements that employ active binary elements also must be individually switched between "ON" to "OFF" states in accordance with appropriate electrical input signals that are applied directly to the individual elements.

In a linear array, there is therefore at least one signal electrode for each element. In an area array, at a minimum there are "X-Y" addressing signals used to power electrode strips that control the transmission of respective row and column signals to correspondingly-addressed elements. By application of suitable potentials to two or more sets of electrodes, individual elements of the display can be switched on or off in a line-by-line manner to produce a complete image.

Such addressing requirements limit the geometry and density of such arrays, and the type and amount of image information that they can produce. The conventional image source therefore must utilize extremely large numbers of signal electrodes, and complex addressing and control methods and circuitry, if they are to meet the stringent requirements in modern, high-density, high resolution imaging applications.

Another disadvantage of conventional image sources is that the aforementioned arrays, whether they be of the linear or area array type, are difficult and costly to manufacture if they are to include a sufficient density of light source elements for the production of a high resolution image. In practice, their light output is typically limited in resolution to approximately 400–600 dots per inch (DPI).

A third disadvantage is the difficulty in achieving accurate, high-speed activation and control of the many individual elements that are selected to comprise an image pattern. This is especially difficult for processing image information that is dynamic, such as that found in video imaging systems. For example, in an area array, a row and column addressing system can be consistent with the addressing techniques used in solid state random access memories and requires little support circuitry to operate one emission or transmission point at a time. However, there is an inherent disadvantage in that such an addressing scheme becomes quite limited when the image pattern to be produced becomes more complex, more detailed, or more transitory.

For example, light emitting diodes (LED's), each of such minute size and arranged in an array of sufficient density so as to provide a high resolution image, are costly to produce as a linear array and are prohibitively expensive if organized as an area array. The interconnection and addressing requirements for an area LED array, not to mention the support circuitry, is also expected to be extremely complex and expensive.

Another inherent disadvantage is that each point in a conventional image source array may be called upon to activate for only a brief moment. The instantaneous brightness of any element must be achieved quickly and to a very high level—a requirement that has not been met in the present state of the art.

Further, conventional image sources are constructed from elements that have relatively large dimensions; these discrete elements are inherently not amenable to high packing densities, and are more prone to manufacturing defects or failure when such densities increase. Only one element is typically dedicated to producing one picture element ("pixel") of the image. Hence, upon the failure of any one image source element, such as an LED, a full "pixel" of image information is permanently lost. The overall image quality of the array is quickly degraded as more and more elements fail.

Conventional image sources that use active electro-optical elements are also relatively inefficient in converting an impressed signal to light, and therefore require large surges of driving current for their activation. Such drive currents require the use of specially-designed power supplies. A large proportion of the current in such power surges is dissipated as heat, which is undesireable and must be removed by the use of heat sinks.

Additionally, the driving signal to conventional active devices such as LED's is typically modulated to circumvent their inherent nonlinearity in light output. The typical electro-optical element is operated according to, for example, pulse-mode modulation. Activation signals for binary elements are abrupt and require a very fast, complex switching matrix or a multiplexing apparatus. The activation signal, pulsed by a current source circuit at a very high rate usually creates significantly undesireable electromagnetic interference (EMI).

Still another disadvantage of an image source based on electro-optical elements is that the array cannot generate true primary colors. LED's that emit in the blue region of the spectrum have only recently been developed and are not practically suited for most applications.

Cathodoluminescent Image Sources

Cathodoluminescent devices are also known for use as image sources in image display and image recording applications. For example, in U.S. Pat. No. 4,803,565, a conventional electrostatic recording apparatus is disclosed as having an optical write head having light emission elements disposed in rows, for forming an electrostatic latent image on a photosensitive material. The construction of the write head is said to include anode patterns formed within an evacuated, closed case. The anode patterns are coated with fluorescing material. A thermionic cathode is heated by an electric current flowing therein, causing the emission of thermal electrons. When the cathode is grounded and a positive voltage is impressed on the anode electrodes, the thermal electrons collide with the florescing material, causing it to fluoresce. To achieve a selected pattern of florescence, the anode electrodes must be distributed in spaced, parallel insulated intervals in an alternating relationship. A circuit must be provided for selectively impressing a predetermined positive voltage individually to each anode electrode to provide a predetermined pattern of light emission corresponding to the desired image dot pattern in an electrostatic latent image on the photosensitive material.

Hence, activation signals for each anode electrode element must be conducted in a complex switching matrix and may require multiplexing. Such apparatus is costly, difficult to manufacture and operate, and generates undesireable electromagnetic interference (EMI). Thermionic ("hot") cathode designs are also very inefficient, and suffer from structural degradation, device failure modes, and many other effects of the heat dissipated at the cathodes.

Much larger scale cathodoluminescent image displays, such as the cathode ray tube (CRT), are known to include a cathodoluminescent layer at the face of the screen which is written by a movable electron beam emitted from a thermionic cathode gun. Unlike the aforementioned arrays of electro-optical elements, a CRT will rather easily display image information in the form of a rapidly time-varying electrical signal in a rasterized format. That is, individual electrodes for each picture element are not used and matrixing is unnecessary. Instead, the controlled deflection of the electron beam allows the CRT to convert signals representative of a rapidly changing image to a displayed image having at fairly high light intensity. The cathode ray tube (CRT) has found widespread application mainly as a low-resolution image display system.

However, large scale cathodoluminescent image sources suffer from many intractable disadvantages. No large-scale cathodoluminescent device has been successfully designed or fabricated as a source of very high-resolution light images. Their thermionic electron source design substantially limits the efficiency of the device as well as its operating life. A CRT, for example, requires a high voltage source on the order of 10,000 to 30,000 volts. Also, these devices require a large, bulky glass envelope so as to contain the electron beam in a high vacuum environment.

There has been significant interest and much effort expended in developing satisfactory "flat panel displays" which obviate the depth requirement of a typical large-scale cathodoluminescent device, while having comparable or better light emission characteristics, e.g., brightness (efficiency), resolution, power requirements, etc. Some flat panel image sources have been produced which utilize single, multiple or ribbon beams directed initially essentially parallel to the plane of the display and then caused to change directions essentially in the Z direction to address appropriate areas of the display target either directly or by way of a selecting and/or focusing grid structure. Examples are the Aiken and Gabor devices, U.S. Pat. Nos. 2,928,014 and 2,795,729, respectively, using single guns, and the RCA multibeam channel guide system as exemplified by U.S. Pat. Nos. 4,103,204 and 4,103,205.

The major drawbacks of flat panel CRT systems still reside in their construction and/or their complex electrical and electron/optical control requirements, their dependency on a thermionic cathode structure, and the requisite ancillary apparatus for providing the high voltage fields necessary to precise electron beam steering. Known flat panel displays are useful for some minor display applications but have not been produced in panels that offer image resolution and image quality in excess of a conventional CRT. Designers of image display and recording apparatus therefore have been limited to the above-described arrays of electro-optical devices as previously described.

Field Emitter Arrays (FEA)

In search of a replacement for the conventional thermionic cathodoluminescent image source, researchers in the field of vacuum microelectronics have pursued the development of microfabricated cold electron sources capable of providing vacuum current densities that are orders of magnitude above those provided by thermionic electron sources. Vacuum microelectronics combines the arts of semiconductor solid-state processing and fabrication techniques with vacuum ballistic electron transport. Arrays of micron-scale, high-current-density cold emitters have been proposed to obviate inefficient and cumbersome low-current-density thermionic cathode designs.

Recent progress in the microfabrication of a low-voltage integrally-gated vacuum electron emitter has resulted in increasing interest in what is known as field emission cathodes, a plurality of which are constructed and arranged as a field emitter array (FEA). Conventional FEA's are arrays of tightly-packed, gated vacuum field emission devices wherein the field emission is based on the quantum mechanical tunneling of electrons through the emitter/vacuum interface upon the application of a high electric field. With field strengths of $5 \times 10^7$ V/cm, extremely high current densities can be extracted: up to $10^6$ A/cm$^2$ in metals. One advantage of field emission is that little energy is expended in extracting the electrons through the surface.

The simplest field emitter array consists of a plurality of extremely sharp micron-scale vacuum electron field emitter tips, each having an integrated conducting extraction gate on an associated dielectric layer. The electron emission is controlled by varying the gate-to-emitter voltage. Electrons emitted from the tip travel ballistically in the vacuum to a drain.

Small-scale cathodoluminescent image display devices have been proposed that comprise baseplates covered with field emitter arrays, each of which is studded with many conic, submicron-sized emitters. When the space between the backplate and a phosphor-coated faceplate is evacuated, and an appropriate voltage is established between the plates, ballistic electrons emitted from the cathodes travel in a relatively straight line to activate the phosphor dots that comprise the pixels on the faceplate. Each pixel thus has a dedicated array of cathodes.

However, other problems have prevented such a structure from being a practical image source. The cathode emitter tips are nonuniform in their output and typically are difficult to manufacture in inexpensive arrays for uniform image generation over a large areas. Furthermore, there is the long-standing problem, common to the aforementioned electro-optical element arrays, in assigning and/or switching discrete portions of an applied electrical signal to the many respective points in the field emitter array. The requisite multiplexing and/or addressing schemes, as described hereinabove, are undesireably complex and expensive when used to selectively activate the field emitter arrays. Moreover, such matrixing schemes can require the switching or modulation of fairly high voltage potentials. The task of switching such potentials at a high rate is quite difficult in practice.

Further background on field emission structures may be found in U.S. Pat. Nos. 3,789,471; 3,812,559; 3,453,478; and 4,857,799; and in *Vacuum Microelectronics* 1989: *Second International Conference on Vacuum Microelectronics*, Turner (ed.), 1989.

Solid State Displays

In a different approach, disclosed in U.S. Pat. No. 3,792,465 and entitled Charge Transfer Solid State Display, a solid state display incorporates a semiconductor charge shift register. Information for display is read into the semiconductor charge devices by shift register action in the form of minority carriers. In one embodiment, the substrate comprises a unitary body of semiconductor material having light-emitting characteristics. Means are provided for reverse biasing the p-n junction to near avalanche breakdown such that the minority carriers corresponding to the data to be displayed trigger avalanche and provide a large quantity of minority carriers for producing a visible display upon recombination with majority carriers.

Nonetheless, there is a major problem associated with a semiconductor charge transfer device that precludes its practical use as a light emitting device. Silicon is the preferred semiconductor material for constructing such a device, and yet silicon does not have a direct energy band gap; hence it has a very low quantum efficiency and therefore its efficiency as an electro-optical light emitter is poor. The available light emitted from such a device via recombination of carriers is generally insufficient for many imaging applications.

SUMMARY OF THE INVENTION

In conceiving an image source constructed according to our invention, we first appreciated that semiconductor-based charge transfer or charge-coupled devices (hereinafter, such devices are meant to be equivalent) have proven to be advantageous in the fields of image sensing and image capture. In our departure from the teachings of the prior art, however, we accordingly sought to achieve the benefits of charge-coupled devices in a novel image source. A brief introduction to charge-coupled theory should first be understood.

A modern charge-coupled device typically includes a metal-insulator-semiconductor structure which stores and transfers data in the form of electrical charge. This structure provides a shift register configuration via two or more sets of conductive electrodes formed on the insulator-semiconductor structure. Clocking pulses are applied to the electrodes that effectively invert the semiconductor surface such that the minority carriers are drawn to the semiconductor-insulator interface and collect in "potential wells" under the conducting electrodes. When the clocking pulses are sufficiently large, the minority carriers transfer from the area under one electrode to the area under the next electrode and thereby follow the potential wells produced by the clocking pulses.

Hence, one very attractive feature for our contemplated image source is that a full line segment of an image data signal (organized as a series of either analog, sampled, or quantized charge packets) could be rapidly stepped through a charge transfer structure. This feature is a distinct advantage over known signal matrixing schemes, which must deliver the image signal in the form of selected voltages on a conductive matrix. The contemplated charge transfer structure therefore does not suffer from the signal propagation delay, distortion, and signal loss found in conventional image source devices. A semiconductor charge-coupled device structure was also attractive due to its relative simplicity, low cost, and ease of fabrication.

Accordingly, we devised an image source which offers the benefits of a small scale cathodoluminescent structure with a semiconductor charge-coupled device structure. In doing so, we have discovered a method and apparatus for converting time-varying serial electronic data (in the form of analog, digital, sampled analog, digitized sampled analog, or other electronic signals) into discrete, high-resolution points of light output. An image source constructed according to the present invention provides a high-resolution light image in response to serial electrical signal inputs. The contemplated image source is expected to be relatively inexpensive to manufacture, simple to operate, and offers high reliability.

The contemplated image source operates from either continuous or discrete time domain image information. With a minimum of signal processing and driving logic the contemplated image source converts an image information electrical signal to discrete parallel light output pixels. The output pixel level may be continuous or discrete, and the level may be modulated. The device offers close to true primary color outputs; a parallel 3-color capability is achieved by arranging three parallel linear arrays. Image resolution above 1000 dpi may be achieved without the recourse to the complex and troublesome addressing, switching, or multiplexing schemes in the prior art.

The device is very efficient in converting the input signal to a light output signal, and neither a high drive current nor high current drive circuitry is required. Consequently, heat dissipation and electromagnetic interference problems are obviated.

The contemplated device can be used in a digital saturation mode for higher light output. Electron current amplification is provided by use of field effect transistors (FETs)

such that a high intensity light output level may be achieved. Because an extremely fast write time is available, the contemplated device may be successfully used in high-speed image exposure or recording scheme.

The image source may be advantageously used in color image transmission or reproduction apparatus such as facsimile machines; electrostatographic reproduction apparatus such as copiers, printers, and duplicators; photographic printing and reproduction apparatus; and flat panel displays for static and dynamic image information.

The contemplated image source includes a component termed herein the CCD emitter, which accepts the serial image signal and converts the signal to parallel discrete electron emissions, the magnitude of which are proportional to the time amplitude of the image information. The CCD emitter includes a semiconductor charge-coupled structure combined with plural gated field emission arrays (FEA). The charge-coupled structure receives charge levels which are then coupled to each field emission array via a floating gate amplifier such that the emission currents of the arrays are modulated by the floating gate amplifier. The emitted electrons are attracted to a phosphor screen backed by a charged, transparent conductive anode layer.

The emitted electrons are accelerated by an electrostatic potential toward the phosphor screen by an electrostatic field between the transparent conductive layer and the substrate of the CCD emitter so that an electron stream having sufficient energy for the desired level of light emission will impact the phosphor layer. The foregoing components are supported and contained in an evacuated transparent envelope. The light emission may be viewed directly, to thus provide an image display, or may be coupled to a photosensitive medium to thereby provide an image recording apparatus.

In one embodiment of the invention, the light output may be directed onto a photosensitive image recording medium to provide means for image recording. Alternatively, we have devised second and third embodiments of the contemplated image source, wherein the light output will form an image to be viewed directly. Either of these alternative embodiments may therefore serve as an image display device.

Further, the output of any of the contemplated embodiments may be collected and transmitted by light transmission means known in the art for remote image recording, display, or other types of processing.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings.

FIG. 5 is a simplified representation of the amplification structure of the charge-coupled device emitter, and a portion thereof, respectively, in the image source of FIG. 3.

FIG. 6 is a schematic representation of a calibration circuit for calibrating the contemplated imaging source of FIG. 3.

FIG. 7 is a side sectional view of a second preferred embodiment of an image source constructed according to the present invention.

FIGS. 8 and 8A are side sectional and front sectional views, respectively, of a third embodiment of an image source constructed according to the present invention.

DETAILED DESCRIPTION OF THE PREFERRED EMBODIMENTS

Figure 1:
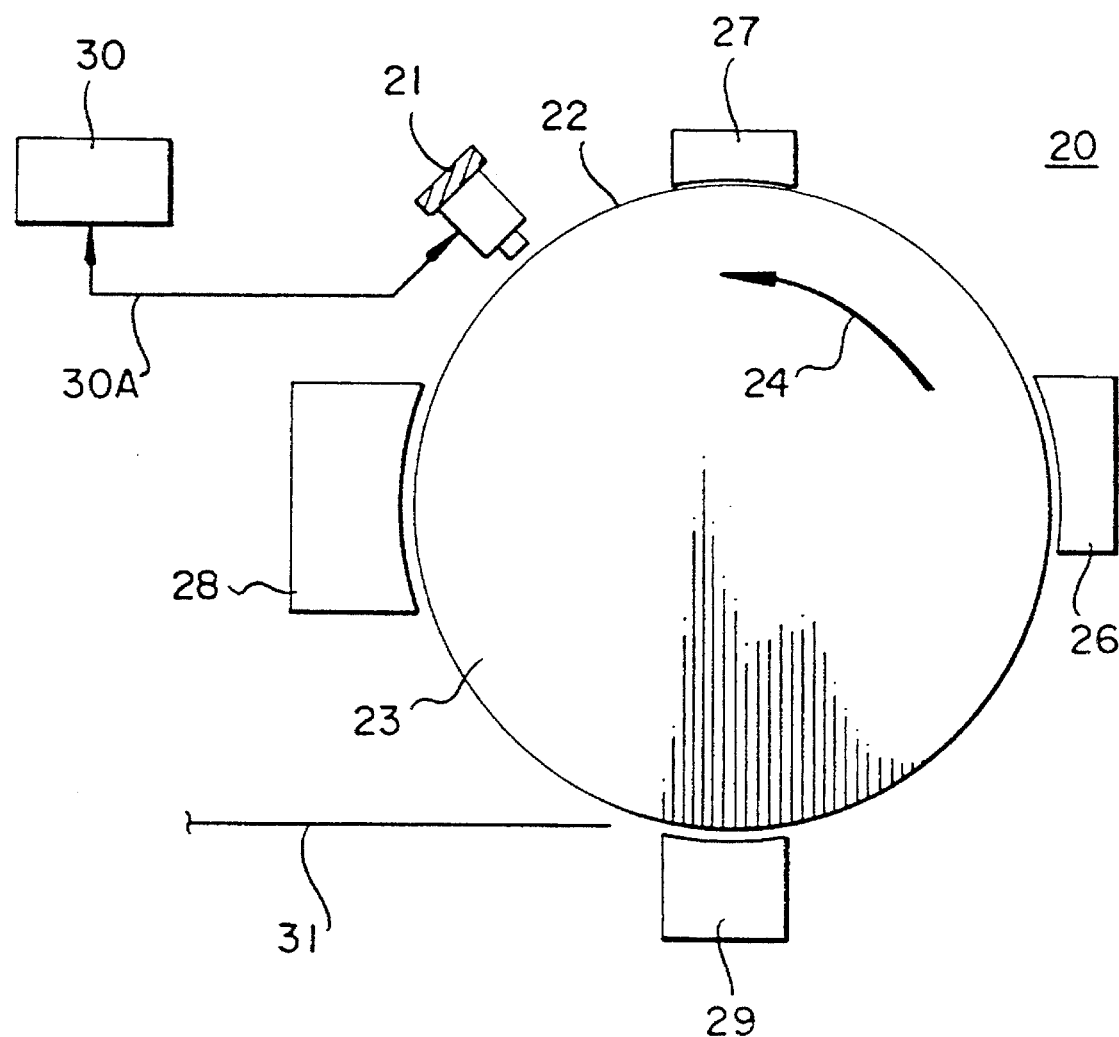
FIG. 1 is a simplified diagrammatic view of an electrostatic reproduction apparatus which incorporates an image source constructed according to the present invention.

With reference to FIG. 1, it will be appreciated that the invention to be described herein will have great utility in an electrostatic recording apparatus. However, an image source constructed according to our invention need not be limited to only one such application, as other image recording apparatus, or display apparatus for providing static and dynamic images for observation, will benefit from this invention.

Accordingly, one preferred embodiment of an image recording apparatus 20 includes an optical write head 21 which incorporates the contemplated image source. The write head 21 is fixed in spaced relationship with a photosensitive material 22 disposed on a rotable drum 23 such that an image frame of the material may be exposed by relative movement there between.

The contemplated photosensitive material 22 is preferably a photoconductive medium formed as an outer layer on the circumference of the photoconductive drum 23 which, in turn, is rotatably connected to a drive device (not shown) for rotation in the direction of arrow 24. The write head 21 may alternatively be made movable for providing the requisite relative movement. The image source includes at its face a row of light emission elements which will emit light in corresponding quanta known as picture elements, or pixels, to form an electrostatic latent image on the photosensitive material 22.

Around the circumference of the photoconductive drum 23, there are disposed: a cleaner 26 for first cleaning the surface of the photosensitive material 22, a charging corotron 27 for providing an electrostatic charge on the photosensitive material 22, and the optical write head 21 for forming the electrostatic latent image. A development unit 28 applies toner to the formed electrostatic latent dot image and a transfer corotron 29 is useable for transferring the toner-developed image onto recording paper 31.

The requisite image data storage, processing, and delivery means (hereinafter data source 30) is interconnected with the write head 21 by a series of data links and control links shown collectively as line 30A. Data source 30 may include, depending upon the application, suitable means to produce print jobs as character code signals queued in a print server, and spooled one page at a time to a raster image processor (RIP). The RIP converts the character code signals to a rasterized video data stream for printing line by line as will be described shortly.

The data source 30 may further include means for data compression, line storage, data expansion, data resequencing, and page buffering (the latter for storing image data as it is processed). A microcontroller may be included to function as the system manager, overseeing the overall operation of the apparatus 20. The microcontroller may handle data and control communications and store the internal pointers identifying the beginning and ending addresses for each image frame and for the rasterized lines of image data that constitute an image frame. The microcontroller may also initiate transfers from the RIP and control the data compression and expansion process. The data source 30 may also include a writer interface which prepares a full line of image data. The foregoing components within the data source 30 are known in the art and thus are not discussed further.

Those skilled in the art will naturally find that modifications to the foregoing reproduction apparatus 20 will easily result in other types of image recording apparatus for exposure of other photosensitive media, such as photographic film. Such modifications and applications are known in the photographic, electrostatographic, reprographic, printing, and facsimile arts.

Figure 2:
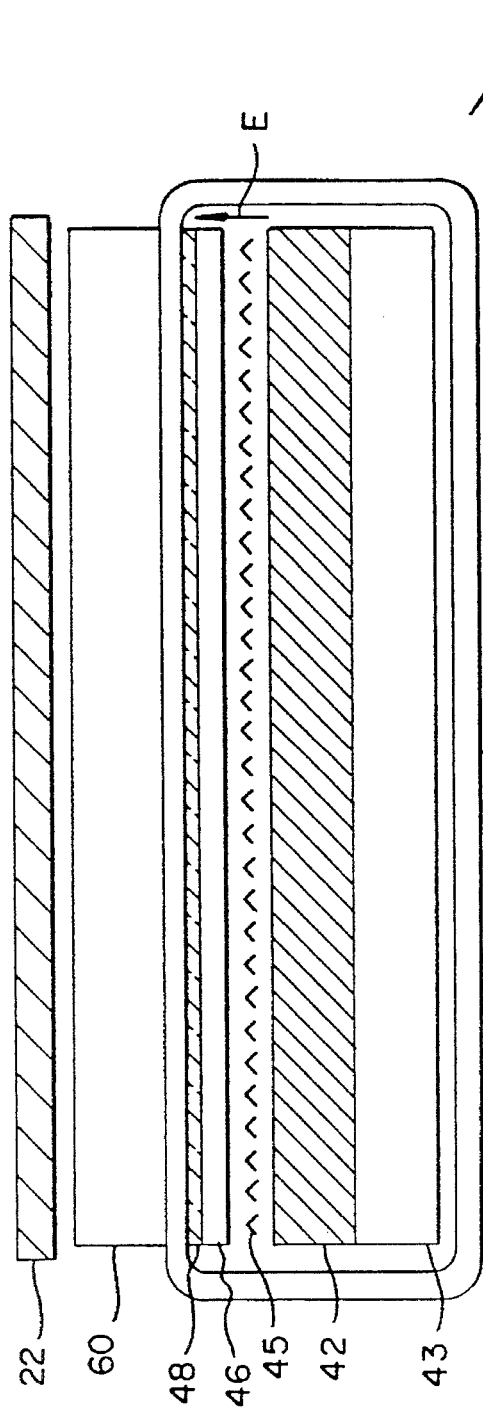
FIG. 2 is a side diagrammatic view of the preferred embodiment of the contemplated imaging source of FIG. 1 in its simplified form.
Figure 3:
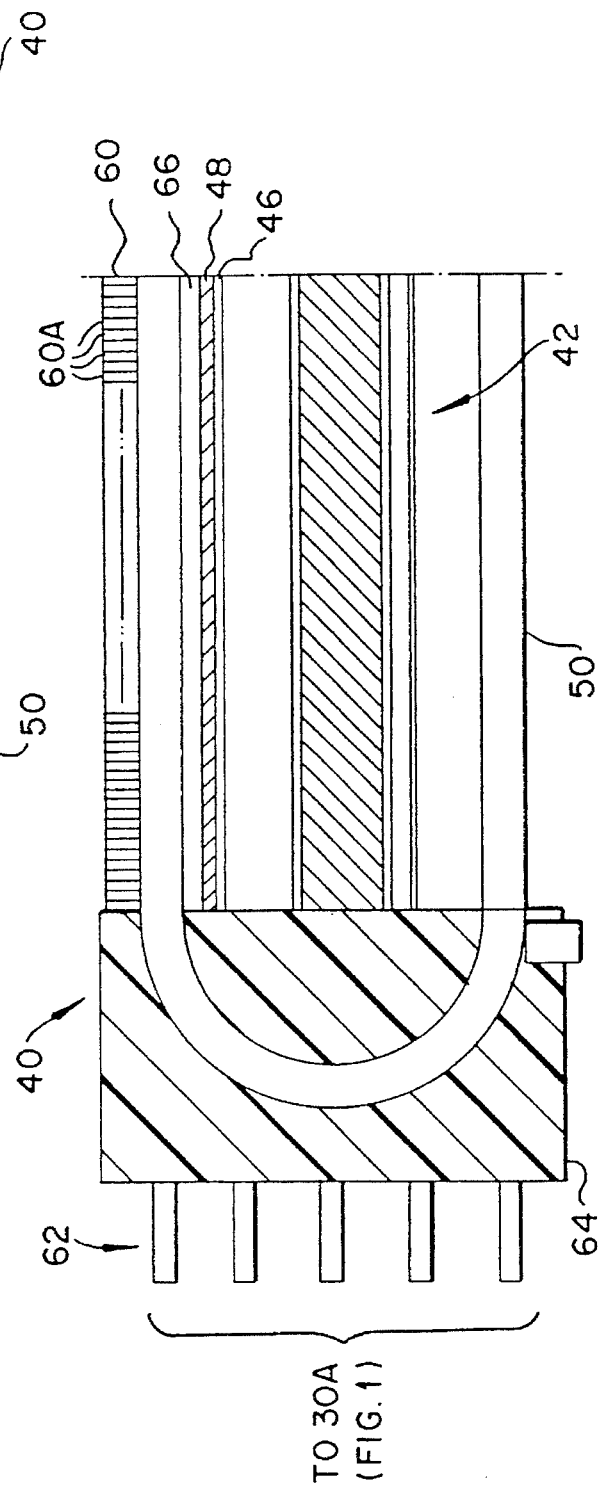
FIG. 3 is a side sectional view of a practical embodiment of the imaging source of FIG. 2.

The construction of the image source according to the present invention is shown in FIGS. 2 and 3. FIG. 2 is a simplified diagrammatic representation in a longitudinal sectional view of the contemplated image source, and FIG. 3 is a fragmentary sectional view of a first preferred embodiment of an image source constructed according to the present invention. It will be understood that the contemplated image source receives data and control information from a data source as already described with respect to FIG. 1.

A preferred embodiment 40 of the image source includes a combined charge-coupled device and integral gated field emission microtip structure (the CCD emitter 42) supported by a planar substrate 43. Emissions of the CCD emitter 42 are controlled by the charge levels stepped into its charge-coupled device structure such that electrons 45 are emitted towards a phosphor screen 46 adjacent a transparent conductive layer 48. The foregoing components are fixed in an evacuated, airtight enclosure 50 that is transparent at its section adjacent the conductive layer 48.

The CCD emitter 42 accepts serial, electronically-encoded time-domain image data and converts the image data to parallel discrete electron emissions. In operation, the emitted electrons 45 are accelerated by an applied electrostatic field, E, to increase their energy level to impact with sufficient energy upon the phosphor coating 46. Activation of the phosphor material is then achieved according to the location and intensity of impacting accelerated electrons, the pattern of which define a desired image segment. Depending upon the application, this pattern of light emission (a pattern of picture elements, or pixels) may be viewed directly, or in the illustrated embodiment, may be directly coupled to the photosensitive material 22 or may be optically coupled to the photosensitive material 22 by an optional optical coupler 60.

Although only one CCD emitter is illustrated, it is contemplated that in practice a line of such devices will be mounted lengthwise within the envelope 50 such that the ends of adjacent CCD emitters are butted or overlapped to form a composite interconnected linear device of the desired length. For clarity, however, only a single CCD emitter will be described with respect to FIGS. 2 et seq.

Relative motion between the photosensitive material 22 and the image source 40, in a direction essentially perpendicular to the long axis of the image source, will allow subsequent rows of image data to be gated into the image source and converted to stripwise portions of an overall image. Repetitive conversion of the serialized image data to corresponding stripwise light emissions, along with relative motion between the image source device and the photosensitive material 22, allows a full frame of image data to be recorded.

Figure 4A:
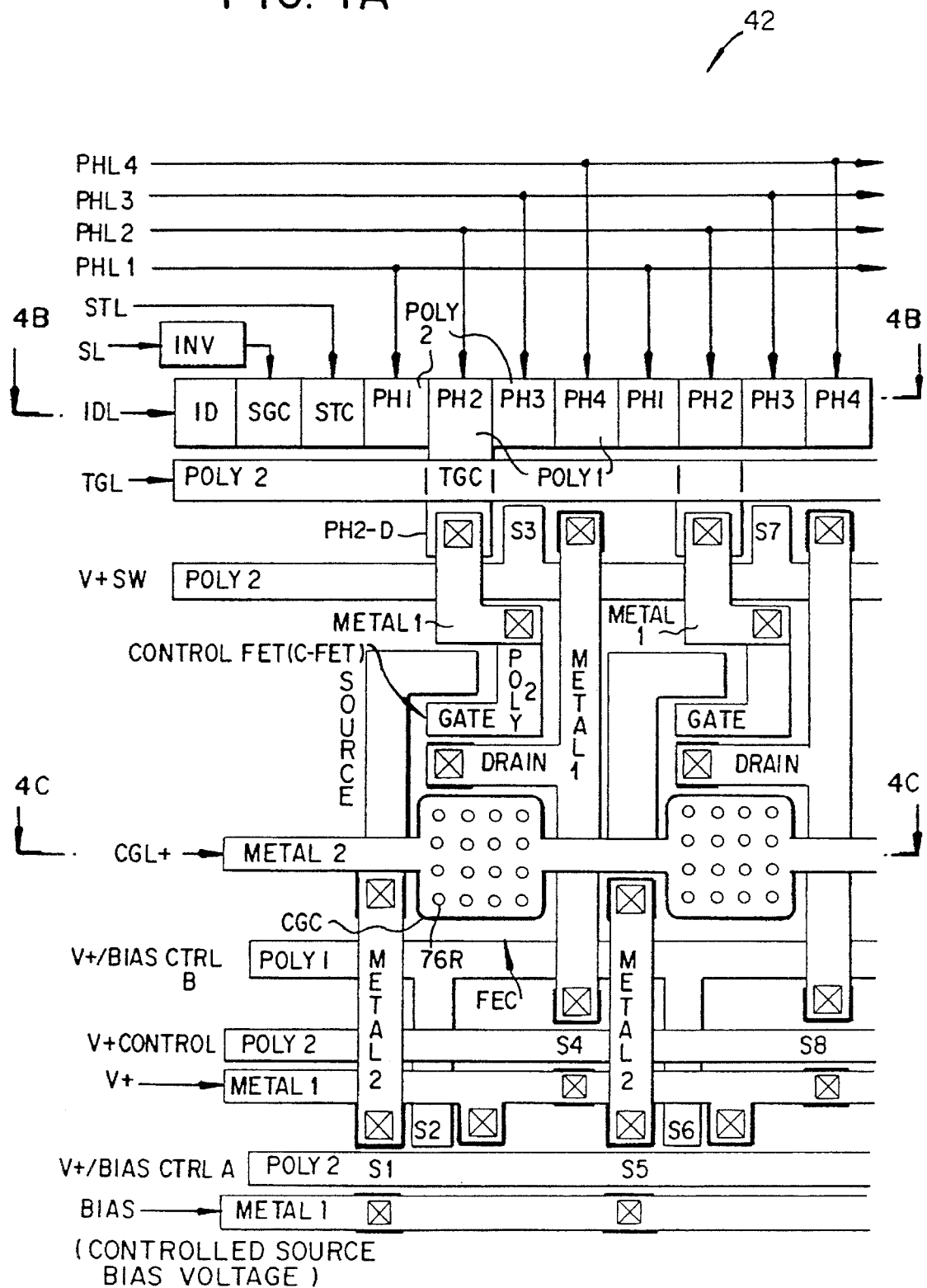
FIG. 4A is a plan view of one portion of the charge-coupled device (CCD) emitter of FIG. 3, with further sectional views of the CCD emitter in FIGS. 4B and 4C.

It will be appreciated that with use of known image data formatting and transmission means, such as a rasterizing image processor (RIP) (not shown), sequential rows of serial image data in the form of electrical impulses are gated into the CCD emitter 42. Each row of data is transferred so as to fill the length of the CCD emitter, as will be discussed with respect to FIGS. 4 & 5, such that the cells of the CCD emitter are filled with discrete charges corresponding to the data to be converted to light. Upon enabling the output of all the cells of the CCD emitter, the data can be nearly instantaneously converted to a respective stripwise emission of electrons.

With reference now to FIG. 3, and in a purely indicative and in no way limiting manner, the components of the image source 40 will be described briefly, with a more detailed description to follow. In practice, a vacuum is maintained in the envelope 50, and therefore signal, power, and ground connections to the CCD emitter 42 and conductive coating 48 are established by use of axial conductors 62 which exit the envelope 50. The transparent envelope 50 is preferably made from glass.

In the embodiment illustrated in FIG. 3, the conductive coating is located between the transparent envelope 50 and the phosphor coating 46. The conductive coating 48 is preferably made transparent to the light emission of the phosphor so as not to obscure the excited phosphor emission of light made visible through the transparent wall of the envelope 50. Conductive coating 48 may be made from aluminum or gold, and insulating portions 64 are made from silica. Preferably, the conductive coating 48 is a tin-doped indium oxide coating. The conductive coating 48 may be eliminated if the phosphor coating 46 is deposited on a portion of the interior surface 66 of the transparent envelope 50, if the envelope portion is formed of a material that is also electrically conductive and connectable to a conductor 62.

In the illustrated embodiment, phosphor coating 48 is disposed on the underside of the transparent envelope 50, such that light emission from the phosphor coating may escape from the side opposite to its excitation. Suitable coatings are formed from crystals known in the art to emit light when energy is transferred to them upon electron collision. Phosphors including rare earth compounds, cadmium, zinc, or a combination of cadmium and zinc form the basic building blocks of the preferred crystalline structure. The phosphor coating 46 may also be composed of zinc sulphide or cadmium sulphide.

Further details on electron stimulation of a luminescent coating, and optimization of same, maybe found in "Selecting Phosphors for Displays," Compton, K., *Information Display*, 1/89, pages 20–25; and "Optical Characteristics of Cathode Ray Tube Screens," *EIA Tube Engineering Advisory Council (TEPAC) Publication* #116.

An optical coupler 60 suited for sub-500 dpi applications is commercially available as the SELFOC Lens Array (SLA) from NSG American, Inc., a subsidiary of NIPPON SHEET GLASS CO., LTD., Tokyo, Japan. The lens array is composed of plural gradient-index cylindrical lenses 60A each having a parabolic refractive index distribution. When the parabolic refractive indices of the individual lenses 60A are aligned, the individual pixels of light emission from the phosphor coating are merged into a continuous image. Such lenses 60A are formed and precisely aligned between fiberglass-reinforced plastic walls (not shown) such that the coupler 60 may be precisely located with respect to the luminescent coating.

As shown in FIGS. 4A, 4B, 4C, and 5, the CCD emitter 42 preferably comprises a four-phase buried channel linear charge-coupled device, although other charge-coupled structures may be used. Control and input lines include phase lines PHL1, PHL2, PHL3, and PHL4, connected respectively to phase cells PH1, PH2, PH3, and PH4. Storage control line STL connects to a storage control cell STC, and a source (image data signal input) line SL connects to an inverter INV and the inverted signal passes then to a signal gate cell SGC adjacent an input signal diode ID. Transfer control line TGL connects to transfer gate TGC. A control gate line CGL connects to a control gate cell CGC, which overlies the linearly spaced arrangement of plural microtip field emission arrays, or field emission cells FEC.

Certain portions of the CCD emitter 42 are preferably formed from layers fabricated on the substrate 43 in a metal-insulative-semiconductor (MIS) structure, including various polysilicon layers (POLY1 and POLY2) and metal layers (METAL1 and METAL2) as noted in the drawings. Associated with each field emission cell FEC in the CCD emitter is charge amplification means including four FET switches (S1, S2, S3, and S4) and a floating-gate control field effect transistor C-FET. The field effect transistor C-FET includes a layered semiconductor structure having a source region SOURCE, a gate region GATE, and a drain region DRAIN. Signals on the V+ SW line in conjunction with signals on the V+ CONTROL line are used to drain or reset all diffusions. Thus, activation of the V+ CONTROL signal activates a drain function of the field effect transistor C-FET. Signal lines V+ BIAS CONTROL A and V+ BIAS CONTROL B carry signals used to switch the source region SOURCE of the field effect transistor C-FET between a predetermined voltage (V+) and a controlled source bias voltage.

To begin an imaging operation, and before the introduction of the first line of image data to the CCD emitter, all diffusions are initially reset by enabling switches S3 and S4, thus connecting a predetermined voltage source V+ to a diffusion region FEA-D and to the drain region of the field effect transistor C-FET. That is, all diffusions are reset by closure of the CCD emitter gate diffusion switches with the line V+ SW and simultaneous closure of the drain line DRAIN to V+ via a signal on line V+ CONTROL. The source region is also switched to V+ before or at the same time by V+ BIAS CTRL B. The line V+ BIAS CTRL A is off. Similar switches designated S7 and S8 are enabled, and so on, so as to reset the other sections of the CCD emitter 42). The C-FET source region SOURCE is also connected to V+ at this time to prevent conduction.

Charge levels linearly related to the input signal on the source line SL may be introduced to the signal gate cell SGC (after signal inversion at inverter INV) by methods known in the art. For example, the image signal may be combined with an appropriate direct current (d.c.) bias voltage on the signal line SL. Since a positive-going signal increases negative charge in the CCD phase cells, which will decrease emission, the signal inversion is required at the input of the CCD emitter 42 for a positive relationship between emission current and signal level. Only the signal itself (not the bias level) need be inverted.

The potential well under the storage gate cell STC is filled with a charge packet (hereinafter, "charge"), upon the storage gate line STL being made positive and the input diode line IDL being brought to a low positive value. After a discrete signal appears on the signal gate line SL, the input diode line IDL is again biased highly positive to transfer some of the charge back from the storage gate cell STC. Thereafter, the charge left under the storage gate cell STC will be a linear function of the inverted signal level at the time of the transfer.

From the storage gate cell STC, the charge is stepped along the phase cells PH1, PH2, PH3, and PH4 of the linear CCD by the polarity relationships of the bias potential applied each of the four phases. In this manner, a series of charge levels are stepped along the length of the CCD that correspond to each discrete data signal element in the serial image data on input signal line SL. Each phase two cell PH2 eventually contains a charge inversely representative of a respective portion of the image data. The timing of charge transfer is preferably synchronized with the frequency of the input signal on the signal line SL. A row indicator embedded in the signal element series can be used to trigger transfer of charge in the emission region and start the introduction of a new row of data elements into the CCD emitter.

(If the input signal is continuous, rather than discrete, the signal gate would be enabled for a short period after the fill period of the storage gate well. In this case, the charge transfer rate would be independent of the input signal rate; resynchronization of the charge transfer would start with each new row of image data that is introduced.)

The field emission cells FEC may then be operated in what is termed an emission cycle, so as to achieve a controlled electron emission that is modulated according to the level of charge found in each respective Phase 2 Cell. The contemplated emission cycle will now be described.

Prior to the emission cycle, a line of image data has filled the CCD structure; the phase two cell charges are ready for transfer with all floating diffusions reset; and the drain and source regions of the field effect transistor C-FET are elevated to the potential of source V+. The phase two gate diffusion PH2-D, controlled by the potential applied to line V+ SW, is off.

Line TGL is then enabled to transfer the charges from all respective phase two cells PH2 to respective external N$^+$ diffusion regions PH2-D. After charge transfer, the C-FET source regions SOURCE are switched from V+ to a bias voltage by V+ BIAS CTRL A and V+ BIAS CTRL B. The field effect transistors C-FET now conduct currents at levels which are a function of the respective charges in the corresponding CCD phase two emitter cells PH2. Next, to activate electron emission, V+ is removed (switched off) from the C-FET drain region DRAIN, and the control line CGL is made positive. The control grid cells CGC now act as drains for each C-FET. A charge-modulated current then flows from the C-FET source to the tips of each FEC, with the subsequent field emission of electrons being a function of the charges on the gate regions GATE of respective field effect transistors C-FET.

After emission, line CGL is disabled, the C-FET source regions SOURCE are switched back to V+ by signals on lines V+ BIAS CTRL A and V+ CTRL B, and the C-FET drain regions DRAIN are switched back to V+ by signals on the V+ CONTROL line. The phase two cell gate diffusions PH2-D are reset by a signal on the V+ SW line. The system is now reset and ready for the next emission cycle.

With the charge having been transferred from the phase two cells PH2, those regions become clear and ready to accept new signal charges. Introduction of a new line of signal charges is then initiated such that after a short time delay (approximately the time it takes to couple the charges from the first element of the CCD line to the last element), all of the phase two cells PH2 contain charge again. The aforementioned emission cycle is again performed to provide another stripwise electron emission.

Depending upon the construction and application of the contemplated CCD emitter, it is contemplated that the initial resetting of the floating diffusions may need no further reset operations during periods of continuous operation. Further, the control gate cell CGL itself may be sufficient to act as the drain for the field effect transistor C-FET, thereby aiding both the resetting and the emission functions.

Other charge gating schemes that are known in the art may be used. Phase two cells PH2 are preferred as the parallel outputs of the CCD structure 42A, but the CCD emitter structure may be modified for output from any one of the phase cells, as is known in the art. Alternatively, the illustrated CCD structure 42A can be modified as known in the art to incorporate a two- or three-phase CCD structure. However, the four-phase CCD structure in the illustrated embodiment is preferred, as a four phase structure is simpler to construct. A buried channel (BCCD) structure is preferred as it requires no bias charge (also known as a "fat" zero) for high charge transfer efficiency, exhibits little or no noise caused by the trapping of charge by fast interface states, and offers a higher frequency response than is provided by a surface-channel device (SCCD) of comparable dimensions.

Further details on the fabrication and operation of the preferred BCCD and SCCD device structure contemplated for use in the present invention may be found in the following references: "Charge Coupled Semiconductor Devices", W. S. Boyle and G. E. Smith, Bell Syst. Tech. J., Vol 49, pp. 587–593, April 1970; "The ABCs of CCDs", Electron. Des., Vol 23, pp. 58–53, Apr. 12, 1975; *Charge Transfer Devices*, Carlo H. Se'quin & Michael F. Tompsett, Academic Press 1975; *Microelectronic Devices*, Edward S. Yang, MaGraw-Hill, 1988; "Charge Coupled Devices—An Overview", Walter F. Kosonocky, 1974 Western Electron. Show and Conv. Tech. Papers, Vol. 18, Sep. 10–13, 1974, pp. 2/1–2/20.

FIG. 5 illustrates the electron emission structure in the CCD emitter in greater detail. A silicon substrate 72 supports a plurality of field emitters 74 so as to comprise a field emission cell FEC. Each emitter 74 is formed as a sharp projection 74 from an electrically conductive $N^+$ region in the silicon substrate 72. An $N^-$ doped region underlies a silicon dioxide insulating layer which supports the phase two channel PH2 and the first transfer gate channel TGC. Beyond the phase two cells lie the gated TGL diffusion regions whose charges control the C-FET emission currents. The control grid cell lines CGL thus act both as drains for the C-FETs and grid electrodes for electron emission. This layer of control grid cells CGC is uniformly insulated and separated from the substrate 72 by a dielectric filler layer. When the control grid line CGL is enabled, with the initial drain disabled (V+ CONTROL "off") and the source grounded, an intense field is applied at the emitter tips to extract electrons from the conduction tips 74 into the vacuum region between the CCD emitter 42 and the phosphor screen 46. Field emission is based on the quantum mechanical tunneling of electrons through the emitter/vacuum interface under the influence of the high electric field, as is known in the art.

Although in FIG. 5 only a few emitters 74 are illustrated, it should be recognized that it is preferable and within the contemplation of the invention to incorporate a large number of emitters in a field emission cell FEC. As disclosed in U.S. Pat. No. 4,874,981, such a cell is generally referred to as an electron-emitting cold cathode array, and is also known as a field emission array (FEA).

While from the broad standpoint the emitting tips 74 could be made separate from the silicon substrate 72, it is preferred for simplicity to integrate the $N^+$ doped region and the tip 74 in one structure. Moreover, the substrate 72 provides both the necessary electrical conduction for the tips and the structural support for the same. It is recognized, though, that this structure could be fabricated differently; for example, the substrate 72 could include a thin film or the like on another type of support. And, although the $N^+$ doped semiconductor region preferably has a level of doping that provides a resistivity of the order of 0.01 ohm-cm, higher resistivities may be used in certain circumstances.

Emitter tips 74 may be made from silicon, lanthanum hexaboride, or from one of the metals taken from the group including niobium, hafnium, zirconium and molybdenum, or a carbide or nitride of said metals. The emitter tips are preferably in the form of cones whose base diameter may be approximately 1–2 mm and whose height may be approximately 1–2 mm. The thickness of each dielectric insulating layer may be approximately 1–2 mm. The dielectric layer may be composed of insulative material such as silicon dioxide or aluminum oxide deposited on the substrate 72 as a thin layer.

The control gate cell CGC is made up of an electrode 76L and plurality of annular openings 76R, each of which circumscribes an associated one of the emission tips 74. Linear electrode sections 76L extend between adjacent annular openings 76R and provide electrical conduction therebetween. The thickness of the control gate cell electrode may be approximately 0.4 to 1.0 mm and the holes therein (for passage of electrons) have a diameter of approximately 1.0 mm on 2 mm centers. The control gate cell electrode 76L is preferably formed of a thin metal film of molybdenum or chromium that is deposited on the dielectric layer.

Packing densities as high as ten million emitters tips per square centimeter are known to have been fabricated. Miniaturization greatly reduces the operating voltages necessary for field emission to take place. Both the insulating dielectric layer and the electrode film 76L are typically etched to provide a region for creating the emission tip 74. That is, in order to achieve the desired field pattern in the structure being described, it is desirable that only the electrode sections 76L be provided in the regions between adjacent emission sites to provide paths to conduct electrical energy between the openings 76R. Areas of the insulating material and electrode layer 76L between adjacent emission sites are removed by etching to reduce its surface area to inhibit buildup of surface charge which may interfere with establishing and maintaining the desired potential field pattern.

Because of the very small size of the emitter tips 74 and the proximity of the respective control gate annular openings 76R, the voltage needed to produce field emission ranges from only a few volts to about 100 volts. The magnitude of the electron current, although limited by structural constraints, is basically a function of both the applied grid voltage at the control gate cell CGC and the field effect transistor C-FET gate voltage. With essentially a constant grid voltage and gate capacitance, the field emission current will be directly related to the charge in the respective CCD phase two cell PH2. Typically, the grid voltage $V_g$ range is from 40 to 150 volts with a tip diameter of 300 angstroms. Field emission arrays are known to operate below 100 volts grid potential and can have emission currents per cathode of over 10 mA. In fact, for special applications, currents of over 100 mA at about 200 V have been measured.

The emitted electrons emerge from the annular openings 76R with correspondingly low energies. Nonetheless, the present invention contemplates the use of multiple emitters in parallel to produce greatly increased emissions for a given applied acceleration voltage, and allows any performance variations in the emitters in one emission cell FEC to be averaged. Further, because of their capability for low-voltage operation, the tips suffer less sputtering caused by ion bombardment. Tests have shown that at 20 mA per cathode, over 40,000 hours of operation is possible. Further details on the construction of a field emission structure suitable for use in the present invention may be found in the following references, the disclosures of which are incorporated herein by reference: U.S. Pat. Nos. 3,789,471, 3,812,559 and U.S. Pat. No. 3,453,478, "Electron Emitting Structure" filed in the name of Kenneth R. Shoulders and Louis N. Heynick; U.S. Pat. No. 4,857,799, "Matrix-Addressed Flat Panel Display", issued in the name of Charles A. Spindt and Christopher E. Holland. Further information may be found in *Vacuum Microelectronics 1989: Second International Conference on Vacuum Microelectronics*, Turner (ed.), 1989; "Vacuum Microelectronics", SRI International Business Intelligence Program, Report No. 780, 1989, pps. 23–29; "Vacuum Semi R&D Picks Up", Electronic Engineering Times, Jan. 29, 1990, pp.35–38.

The predictability of emission using any selected voltage, and reproducibility of results, depends upon the ability to produce and reproduce like emitter tips 74 which are uniformly spaced with uniform apical angles. Such construction methods are known to the art and are disclosed, for example, by methods described in U.S. Pat. No. 3,789,471 or the Shoulders and Heynick U.S. Pat. No. 3,453,478, the disclosure of which is incorporated herein by reference. Emitter tips that have essentially identical configurations may be provided by means described by C. A. Spindt in "A Thin-Film Field Emission Cathode" in the Journal of Applied Physics, Vol. 39, No. 7, pp.3504–3505, June 1968.

As shown in FIG. 6, it may be necessary to calibrate the output of the image source 40 on a pixel by pixel basis using a test signal from a signal generator 80. Light output of each pixel 81-1, 81-2, 81-3, . . . 81-N along the length of the image source 40 is first measured by a calibrated photosensitive sensor 82. The measurement data is output to a comparator 84 for pixel-by-pixel comparison with a reference level provided by a calibrated level source 86. A timing signal from timing signal source 80 is also input to the comparator 84. A response curve is generated by the comparator, which is stored in a pixel correction network 88 that precedes the image source 40 in the image data signal chain. Input signals to the image source 40 are thereafter pre-emphasized by the pixel correction network 88 to adjust the incoming serial image data signal.

As shown in FIG. 7, a second preferred embodiment 90 of the contemplated image source may constructed to provide an area image display means for direct viewing by a human observer. A plurality of CCD emitters 92-1, 92-2, . . . 92-N (each being equivalent to the CCD emitter 42 of FIG. 4) are arranged in parallel rows on a planar support 91. Each CCD emitter 92-1, 92-2, . . . 92-N is situated closely adjacent, if not contiguous with, the adjacent CCD emitters; the devices are separated for clarity in the illustration. The foregoing components are enclosed in an evacuated transparent envelope 95 having roughly plane parallel front and rear faces 95F and 95R. A conductive coating 94 and a luminescent phosphor layer 96 are incorporated in the front face 95F, which is transparent and thus serves as the display face. Electrical connections (not shown) are provided through the envelope 95 to the components mounted within by conductor means (not shown) similar to those previously discussed with respect to FIG. 3, or by means known in the art.

Each CCD emitter 92-1, 92-2, . . . 92-N is provided with one respective line of rasterized image data signal from an image frame; the total complement of the CCD emitters thus can receive image data on a frame-by-frame basis. That is, any one image frame to be displayed is apportioned into sequential lines of image data that are respectively directed to successive (top to bottom, or vice-versa) CCD emitters 92-1, 92-2, . . . 92-N. Such data may, for example, be provided by image frame storage and processing circuitry (not shown), which may include a raster image processor (RIP), as known in the art.

The processed image signals are provided such that the charge levels held therein (as was described with respect to FIGS. 4 and 5) are either sequentially (row-by-row) or simultaneously (in flash mode) converted to multiple stripwise electron emissions. Emitted electrons are accelerated toward the conductive coating 94 with sufficient energy such that the phosphor layer is activated in a respective imagewise pattern.

By activating the full complement of CCD emitters either sequentially or simultaneously, a full frame of image data may thereby be converted to a light image which is displayed from the front face 95F. Due to the light emission by certain phosphors, which may be selected as known in the art, the light image on the display face 96 is recreated for viewing by a human observer 100.

If the conversion of the image signals is performed one line at a time, certain ones of the CCD emitters may be loaded with data while others are in the process of providing an electron emission. Alternatively, an entire frame of image data may be entered into the full complement of CCD emitters, after which the CCD emitters provide primary stripwise electron emissions sequentially or simultaneously. With a suitable refresh rate, it is contemplated that the illustrated embodiment will provide full-frame, high resolution display of image data. The conversion of signals to light is extremely rapid and therefore dynamic data signals, such as video image data, may be reproduced with very high resolution and at a high frame rate.

As illustrated in FIGS. 8 and 8A, a third preferred embodiment 110 of the contemplated image source may be constructed to provide another image display means. A CCD emitter 112 (equivalent to the CCD emitter 42 of FIG. 4) is provided within a transparent evacuated envelope 114 having roughly plane parallel front 114F and rear 114R walls, the first of which includes a display face 114D. Within the envelope 114 and incorporated into the interior surface of the front wall 114F are a transparent conductive coating 116 and a luminescent phosphor coating 118; mounted in opposition to the display face, on the interior surface of the rear wall 114R, are a plurality of selectably operable vertical deflection electrodes 120. Another set of spaced, selectably operable parallel acceleration electrodes 122 are provided proximate to the CCD emitter 112 also respectively at the interior of the envelope 114. Electrical connections to the foregoing components are made as known in the art, preferably through the envelope ends (the ends of the envelope 114 are perpendicular to the front and rear walls, and are not shown for clarity.)

The CCD emitter 112 is provided with a full frame of rasterized image data signals on a line-by-line basis. Such data may, for example, be provided by video image processing circuits as are known in the art. Each line of image data is converted to a respective stripwise primary emission of electrons 130 emitted orthogonal to the CCD emitter face and along a path 132 spaced roughly equidistant between the front and rear walls 114F and 114R. The accelerating electrodes 122 are then sequentially activated to provide an accelerating electrostatic field potential such that the entire strip of emitted electrons 130 achieve a selected momentum in a direction parallel to the front wall 114F.

As the accelerated electrons on path 132 enter the zone behind the phosphor coating 118, the vertical deflection electrodes 120 are selectively activated to steer the electrons into the phosphor coating 118. Accordingly, the data corresponding to one line of the image frame is converted to a corresponding stripwise light emission. By rapidly inputting in succession the data corresponding to the remaining line portions of the image frame, and accordingly altering the characteristic and timing of the electron acceleration and vertical deflection, a full frame of dynamic image data may be reproduced on the display face 114D. Subsequently, the entire image frame may be refreshed in a continuous, high-rate repetition of the foregoing steps. Changes in the image frame information content may be accommodated nearly instantly.

To accomplish a three-color display of respective color image data, the phosphor coating is preferably composed of plural sets of three-color phosphor segments. The foregoing stripwise emission of electrons is modified to a succession of three single color stripwise emissions, each of which being driven by corresponding lines of single color image data. Each stripwise electron emission is directed by the deflection electrodes into a respective one of the three colored phosphor sgments. With successive line emissions, repeated at a high rate, an entire three color image frame is activated for display at the phosphor coating.

The invention has been described in detail with particular reference to preferred embodiments thereof, but it will be understood that variations and modifications can be effected within the spirit and scope of the invention.

What is claimed is:

1. An image source for converting plural electrical charges representative of image information to a respective imagewise pattern of light, comprising:

a CCD emitter having:

a) charge-coupled means for storage and transfer of the electrical charges in respective phase cells therein, b) plural field emission cells, c) plural charge amplification means each having a gate operatively coupled to a selected phase cell and a channel operatively coupled to a selected field emission cell, such that current in the channel is conducted to the field emission cell for emission therefrom according to the charge level in the cell;

a substrate for supporting the charge coupled means, field emission cells, and charge amplification means;

luminescent means, aligned with the field emission means, for converting the electron emissions to the imagewise pattern of light; and means for attracting the electrons emitted from the field emission cells to the luminescent means.

2. An image source for converting a line of serial electrical charges representative of image information into a respective imagewise pattern of light, comprising:

semiconductor charge-coupled means for transfer and storage of the electrical charges in respective phase cells therein;

plural field emission cells each comprising a plurality of microtip emitters, the cells being integrally aligned with selected ones of the charge-coupled device cells;

plural field-effect transistors each having a gate operatively coupled to a selected phase cell and a channel operatively coupled to a selected field emission cell, such that current in the channel is conducted to the field emission cell for emission therefrom according to the charge level in the phase cell;

activation means for selectively activating plural field emissions;

luminescent means, aligned with the field emission cells, and means for attracting the electron emissions to the luminescent means whereby the imagewise pattern of light may be effected.

3. An image source for converting plural electrical charges representative of image information to a respective imagewise pattern of light for viewing by a human observer, comprising:

a CCD emitter having:

a) charge-coupled means for storage and transfer of the electrical charges in respective phase cells therein, b) plural field emission cells, and c) plural charge amplification means each having a gate operatively coupled to a selected phase cell and a channel operatively coupled to a selected field emission cell, such that current in the channel is conducted to the field emission cell for emission therefrom according to the charge level in the phase cell;

electron acceleration means, aligned with the CCD emitter and adapted for accelerating the electrons emitted therefrom;

electron steering means for directing the accelerated electron emissions along a selected beam path; and luminescent means, located in the beam path, for providing light output in the imagewise pattern according to the electrons incident thereon.

4. The image source of claim 1, wherein the charge amplification means is formed in a metal-insulator-semiconductor (MIS) structure on the substrate.

5. The image source of claim 1, wherein the charge-coupled means is formed in a metal-insulator-semiconductor (MIS) structure.

6. The image source of claim 5, wherein the charge-coupled means further comprises a four-phase buried-channel charge-coupled device.

7. The image source of claim 1, wherein each field emission cell further comprises a plurality of microtip emitters.

8. The image source of claim 1, wherein the phase cells are linearly connected for stepwise storage and transfer a series of charges therethrough, and each of the field emission cells are aligned with a selected phase cell such that emission therefrom corresponds to the charge in the respective phase cell.

9. The image source of claim 1, further comprising activation means for simultaneous activation of field emission from a plurality of the field emission cells.

10. The image source of claim 1, further comprising additional CCD emitters, the opposing ends of adjacent CCD emitters being butted together and operatively connected to form a linear unit.

11. The image source of claim 1, further comprising additional CCD emitters, the opposing ends of adjacent CCD emitters being overlapped and operatively connected to form a linear unit.

12. The image source of claim 1, further comprising:

envelope means for maintaining in an evacuated environment the CCD emitter, luminescent means, and means for attracting emitted electrons, and means for providing electrical connections through the envelope to the CCD emitter, luminescent means, and means for attracting emitted electrons while maintaining the evacuated environment.

13. The image source of claim 12, wherein the luminescent means further comprises a luminescent phosphor coating integral with the envelope at a portion thereof, the portion being transparent to the light output from the phosphor coating.

14. The image source of claim 13, wherein the means for attracting the electron emission further comprises a transparent conductive coating integral with at least one of the phosphor coating and the envelope means.

15. The image source of claim 1, further comprising an optical coupler aligned with the luminescent means for coupling the imagewise pattern of light to an image plane.

16. The image source of claim 15, wherein the optical coupler further comprises a gradient-index lens array.

17. The image source of claim 2, wherein the field effect transistors are formed from a metal-insulator-semiconductor (MIS) structure.

18. The image source of claim 2, wherein the phase cells are formed from a metal-insulator-semiconductor structure.

19. The image source of claim 18, wherein the charge-coupled means comprises a buried-channel CCD structure.

20. The image source of claim 2, wherein the activation means may be operated to provide simultaneous electron emissions from the field emission arrays.

21. The image source of claim 2, wherein the phase cells are linearly connected for stepwise storage and transfer of serial charges therethrough, and each field emission cell is aligned with a selected phase cell such that field emission corresponds to the charge in the selected phase cell.

22. The image source of claim 2, further comprising:

envelope means for maintaining the charge-coupled means, field emission cells, and field-effect transistors in an evacuated environment, and means for providing electrical connections through the envelope while maintaining the evacuated environment.

23. The image source of claim 22, wherein the luminescent means further comprises a luminescent phosphor coating integral with the envelope means at a portion thereof, the envelope portion being transparent to the light output from the phosphor coating.

24. The image source of claim 23, wherein the means for attracting emitted electrons comprises a transparent conductive coating integral with at least one of the phosphor coating and the envelope portion.

25. The image source of claim 2, further comprising an optical coupler aligned with the luminescent means for coupling the imagewise pattern of light to an image plane.

26. The image source of claim 25, wherein the optical coupler further comprises a gradient-index lens array.

* * * * *